United States Patent
Liu et al.

(10) Patent No.: US 9,692,255 B2
(45) Date of Patent: Jun. 27, 2017

(54) POWER SUPPLY SYSTEM AND CONTROL METHOD THEREOF

(71) Applicants: LITE-ON ELECTRONICS (GUANGZHOU) LIMITED, Guangzhou (CN); LITE-ON TECHNOLOGY CORP., Taipei (TW)

(72) Inventors: Yu-Shun Liu, Taipei (TW); Shi-En Wang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 465 days.

(21) Appl. No.: 14/289,963

(22) Filed: May 29, 2014

(65) Prior Publication Data

US 2015/0171664 A1   Jun. 18, 2015

(30) Foreign Application Priority Data

Dec. 13, 2013 (CN) .......................... 2013 1 0680477

(51) Int. Cl.
*H02J 9/06* (2006.01)
*H02M 1/00* (2006.01)
*G01R 27/26* (2006.01)
*H02J 7/00* (2006.01)
*H02J 7/34* (2006.01)

(52) U.S. Cl.
CPC ............ *H02J 9/061* (2013.01); *H02J 7/0063* (2013.01); *G01R 27/2605* (2013.01); *H02J 7/345* (2013.01); *H02J 2007/0067* (2013.01); *H02M 2001/0096* (2013.01); *Y10T 307/615* (2015.04)

(58) Field of Classification Search
CPC ............ H02J 7/345; H02M 2001/0096; G01R 27/2605; Y10T 307/615
See application file for complete search history.

(56) References Cited

U.S. PATENT DOCUMENTS

| | | | |
|---|---|---|---|
| 8,004,260 B2* | 8/2011 | Irving ................. | H02M 1/4225 323/282 |
| 8,957,655 B2* | 2/2015 | Galinski, III ....... | H02M 3/1582 323/282 |
| 9,007,087 B2* | 4/2015 | Avritch ................ | G01R 31/028 324/764.01 |
| 2015/0340882 A1* | 11/2015 | Goth ..................... | H02J 7/0052 320/167 |

* cited by examiner

*Primary Examiner* — Ryan Johnson
(74) *Attorney, Agent, or Firm* — Rosenberg, Klein & Lee

(57) ABSTRACT

A control method for implementation in a power supply system includes steps (A), (B), and (C). In step (A), while the power supply system is providing electricity to a load, a control circuit determines, an estimated capacitance value related to an output capacitor. In step (B), while the output capacitor is providing electricity to the load, the control circuit determines an average power value related to the electricity provided by the output capacitor to the load. In step (C), the control circuit determines an estimated hold-up time value related to the power supply system based on a predetermined target voltage value, a predetermined minimum voltage value, the average power value and the estimated capacitance value.

20 Claims, 4 Drawing Sheets

POWER SUPPLY SYSTEM AND CONTROL METHOD THEREOF

CROSS-REFERENCE TO RELATED APPLICATION

This application claims priority of Chinese application no. 201310680477.4, filed on Dec. 13, 2013.

BACKGROUND OF THE INVENTION

1. Field of the Invention

The present invention relates to a control method for implementation in a power supply system and to a power supply system applying the same.

2. Description of the Related Art

Conventional electronic devices (such as computers, servers, etc.) receive electricity from a power supply that converts electricity from an external power source (such as commercial power), or receives electricity from power supply devices such as a battery, an uninterruptible power supply (UPS), etc. Conventionally, the electronic devices switch to using electricity from the power supply device when the external power source is cut-off. However, as soon as the external power source is cut-off, the power supply of the electronic device is required to continue providing electricity to the electronic device for a period of time before the power supply is able to switch to receiving electricity from the power supply device, ensuring a continuous supply of electricity to the electronic device. This period of time is referred to as a hold-up time in a hold-up operation that ensures continuous supply of electricity to the electronic device.

In the product specification of such electronic devices, a preferred hold-up time is usually specified (such as longer than 10 milliseconds). The hold-up time of a power supply is mainly related to a bulk capacitance of an output capacitor in the power supply, and is also affected by a load of the power supply. The actual bulk capacitance of the output capacitor of the power supply, when compared to a capacitance design value, usually has an error of +/−20%. Therefore, such error should be taken into account when designing the power supply in order to achieve a desired hold-up time. For instance, both a maximum error of the capacitance value of the output capacitor (such as −20%) and the type of the load electrically coupled with the power supply are taken into account in order to ensure that the hold-up time of the power supply satisfies a design requirement.

Although the above-mentioned hold-up time of the power supply may satisfy a design requirement, the actual hold-up time of each power supply and the actual bulk capacitance value of the output capacitor are not displayed. Therefore, this is disadvantageous for production management of the power supply during manufacturing, and it is inconvenient for a user to perform power management related to the power supply.

Moreover, the bulk capacitance of the output capacitor of the power supply usually decreases with time, and the rate of decrease may vary from one output capacitor to another, not to mention that the load electrically coupled with the power supply may also be modified or swapped. Additionally, it may also be difficult for a user to obtain the actual bulk capacitance of the output capacitor while the power supply is outputting electricity to the load. Thus, a hold-up time of the user's power supply may not be estimated, and this presents difficulties for the user to perform power management related to the power supply.

SUMMARY OF THE INVENTION

Therefore, an object of the present invention is to provide a control method for implementation in a power supply system that can assist a user in power management of the power supply system.

According to one aspect of the present invention, there is provided a control method for implementation in a power supply system. The power supply system includes a converter circuit, an output capacitor electrically coupled with the converter circuit, and a control circuit electrically coupled with the converter circuit and the output capacitor. The power supply system is configured to provide electricity to a load. The control method comprises the following steps:

(A) while the power supply system is providing electricity to the load, determining, using the control circuit, an estimated capacitance value related to the output capacitor;

(B) while the output capacitor is providing electricity to the load, determining, using the control circuit, an average power value related to the electricity provided by the output capacitor to the load; and (C) determining, using the control circuit, an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor.

Another object of the present invention is to provide a power supply system that applies the control method of this invention.

According to another aspect of the present invention, a power supply system is configured to receive electricity from an external power source and to convert the electricity from the external power source into output power to be provided to a load. The power supply system comprises:

a converter circuit to be electrically coupled with the external power source to receive the electricity therefrom, and operable to output the electricity from the external power source after conversion;

an output capacitor electrically coupled with the converter circuit and to be coupled with the load, the output capacitor receiving electricity from the converter circuit and be ing charged and discharged under control of the converter circuit; and a control circuit electrically coupled with the converter circuit and the output capacitor, and operable to control operation of the converter circuit.

While the power supply system is providing electricity to the load, the control circuit is configured to determine an estimated capacitance value related to the output capacitor.

While the output capacitor is providing electricity to the load, the control circuit is further configured to determine an average power value related to the electricity provided by the output capacitor to the load.

The converter circuit is further configured to determine an estimated hold-up time value related to the power supply system based on a predetermined target voltage value, a predetermined minimum voltage value, the average power value and the estimated capacitance value. The predetermined target voltage value is associated with an amount of electricity required by the output capacitor for hold-up operation of the power supply system and provided by the converter circuit to the output capacitor. The predetermined minimum voltage value is associated with a minimum voltage of the output capacitor.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
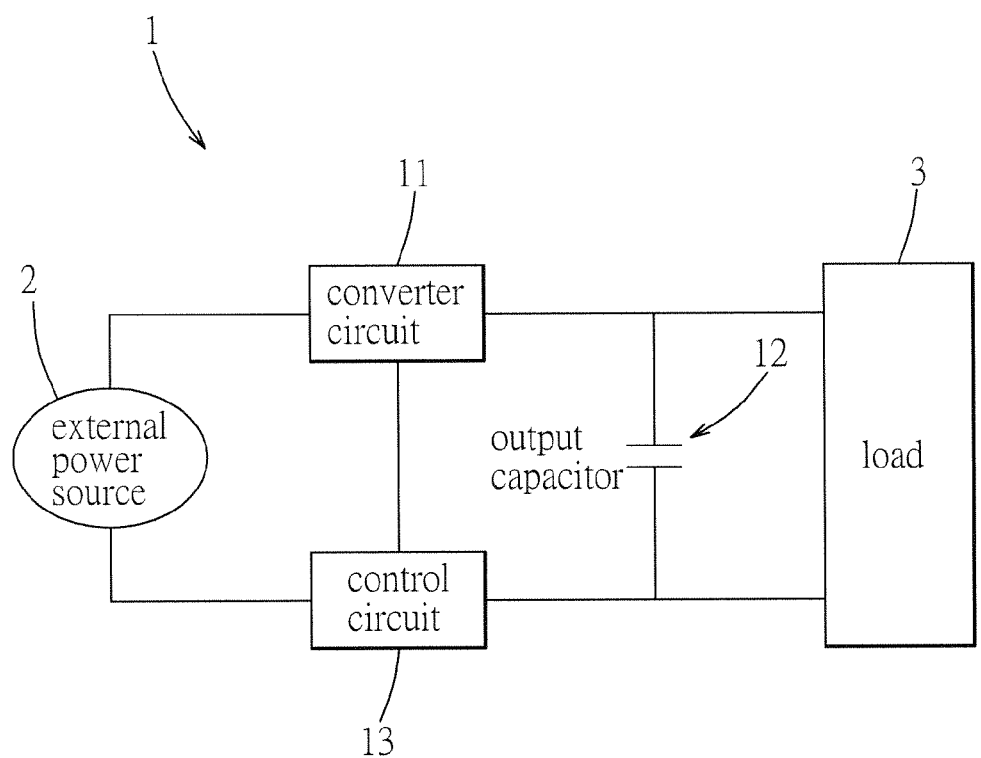
FIG. 1 is a schematic block diagram illustrating a power supply system according to a preferred embodiment of the present invention.

FIG. 1 shows a preferred embodiment of a power supply system 1 according to this invention. The power supply system 1 includes a converter circuit 11, an output capacitor 12, and a control circuit 13. The power supply system 1 is configured to receive electricity from an external power source 2 and to convert the electricity from the external power source 2 into output power to be provided to a load 3.

The converter circuit 11 is electrically coupled with the external power source 2, the load 3, the output capacitor 12 and the control circuit 13, receives the electricity from the external power source 2, and is controlled by the control circuit 13 to convert the electricity from the external power source 2 into output power to be provided to the load 3. For realizing the power supply system 1, the converter circuit 11 can be implemented as a direct current to direct current voltage step down power converter (buck converter), a direct current to direct current voltage step up power converter (boost converter), a direct current to direct current voltage step down and voltage step up power converter (buck-boost converter), etc.

The output capacitor 12 is electrically coupled with the converter circuit 11, the control circuit 13, and the load 3. The output capacitor 12 receives electricity from the converter circuit 11 and is either charged or discharged under control of the converter circuit 11.

The control circuit 13 is electrically coupled with the converter circuit 11, the output capacitor 12, the external power source 2, and the load 3. The control circuit 13 is operable to control operation of the converter circuit 11 for outputting the electricity, and is operable to detect and monitor the status of voltage, current and power of the converter circuit 11, the output capacitor 12, the external power source 2 and the load 3. As an example, the control circuit 13 can include at least a micro control unit (MCU) chip that is operable to perform the control and detection procedures as described above. According to actual design needs, the control circuit 13 can be implemented using digital signal processor (DSP), digital signal controller (DSC), micro processor unit (MPU), field programmable gate array (FPGA), or other types of analog control chips for performing the control and detection procedures.

Figure 2:
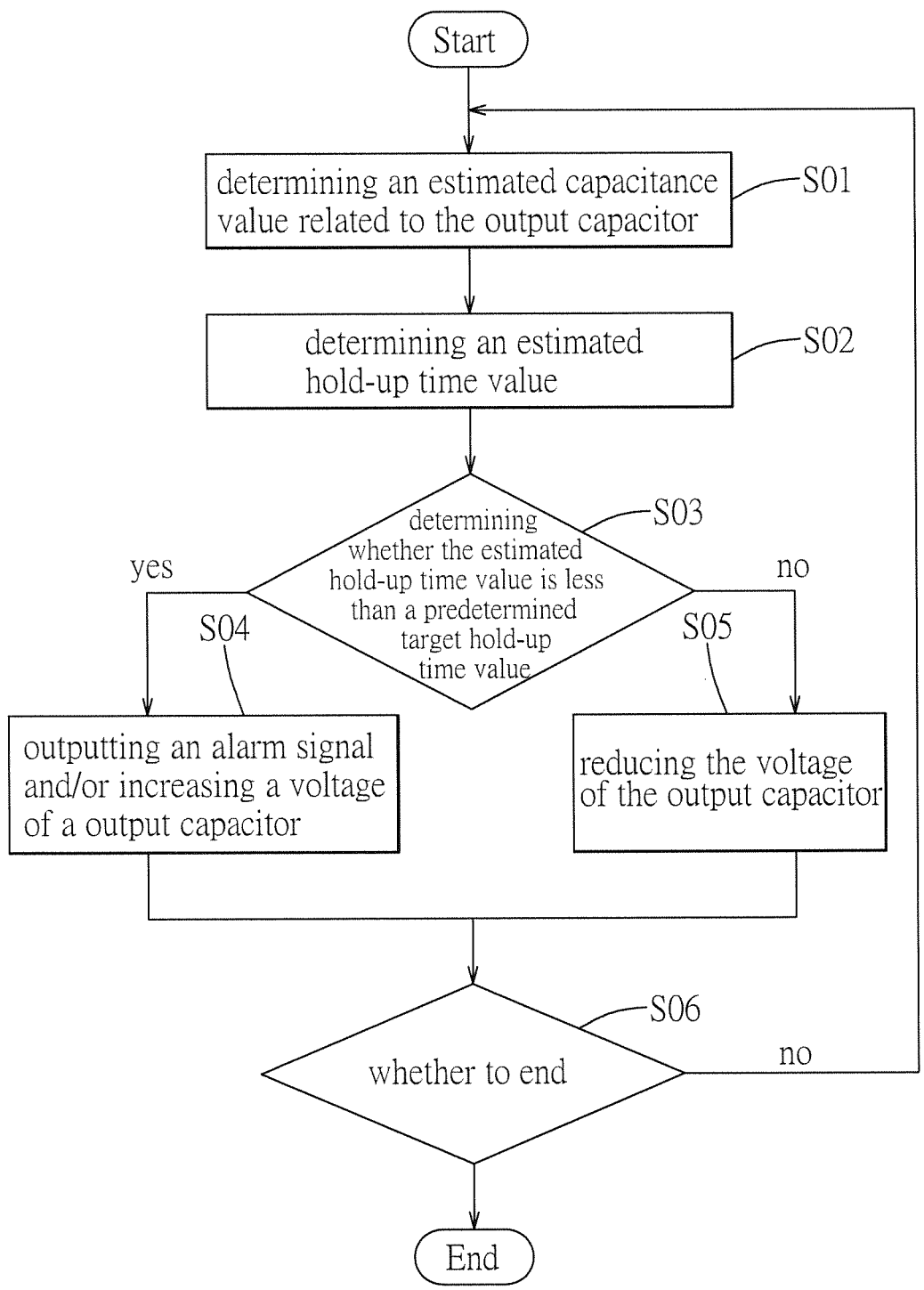
FIGS. 2 to 4 are flow charts illustrating a control method for implementation in the power supply system according to a preferred embodiment of the present invention.

FIG. 2 shows a flowchart of a control method implemented in the power supply system 1. The control method determines, by an on-line detection method, an estimated capacitance value related to the output capacitor 12 and an estimated hold-up time value of the power supply system 1, with both values being determined while the power supply system 1 is continuously providing electricity to the load 3.

Step S01: The first step of the control method is to determine the estimated capacitance value related to the output capacitor 12 by on-line detection. In this step, the estimated capacitance value related to the output capacitor 12 is determined while the power supply system 1 is continuously providing electricity to the load 3. In this embodiment, there are three methods proposed for determining the estimated capacitance value related to the output capacitor 12.

Method 1. Electricity Discharging Method

Figure 3:
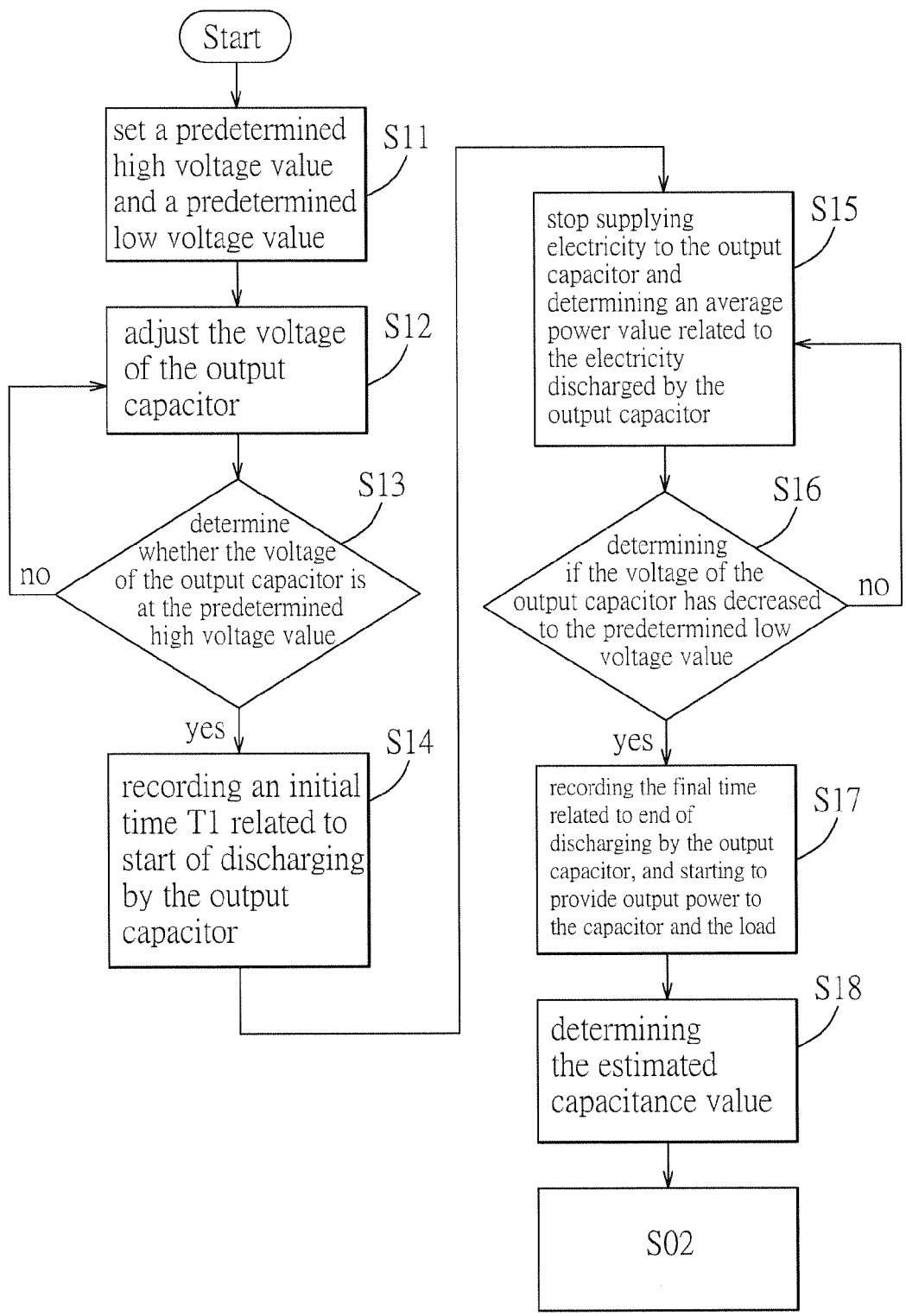

Referring to FIG. 3, the estimated capacitance value $C_{bulk}$ of the output capacitor 12 is determined by the output capacitor 12 discharging electricity to the load 3, and by calculating according to the formula:

$$C_{bulk} = \frac{2 \cdot W_1 \cdot \Delta T_1}{V_1^2 - V_2^2}$$

Where $C_{bulk}$ represents the estimated capacitance value of the output capacitor 12; $V_1$ represents a predetermined high voltage value (an initial voltage of the output capacitor 12) before the output capacitor 12 starts discharging electricity to the load 3; and $V_2$ represents a predetermined low voltage value (a final voltage of the output capacitor 12) after the output capacitor 12 has finished discharging electricity to the load 3. $\Delta T_1$ represents a time interval during which the output capacitor 12 discharges electricity to the load 3 and thus the voltage of the output capacitor 12 decreases from the predetermined high voltage value $V_1$ to the predetermined low voltage value $V_2$ (the initial voltage of the output capacitor 12 being greater than the final voltage of the output capacitor 12). $\Delta T_1$ may be calculated according to the formula:

$$\Delta T_1 = T_2 - T_1$$

where $T_1$ represents an initial time related to start of discharging by the output capacitor; and $T_2$ represents a final time related to end of discharging by the output capacitor 12.

Moreover, $W_1$ represents an average power value related to the electricity discharged by the output capacitor 12 within the time interval $\Delta T_1$.

In steps S11, S12 and S13, the control circuit 13 is controlled to set the predetermined high voltage value $V_1$ and the predetermined low voltage value $V_2$. The control circuit 13 controls the converter circuit 11 to output electricity to charge the output capacitor 12 until the voltage of the output capacitor 12 reaches the predetermined high voltage value $V_1$. For example, if the voltage of the output capacitor 12 is 385 volts initially, the predetermined high voltage value $V_1$ is set to be 400 volts, and the predetermined low voltage value $V_2$ is set to be 380 volts, the control circuit controls the converter circuit 11 to convert electricity from the external power source 2 into an output power, and provides the output power to the output capacitor 12, such that the voltage of the output capacitor 12 increases. While the output capacitor 12 is being charged, the control circuit 13 will constantly monitor and determine whether the voltage of the output capacitor 12 is at the predetermined high voltage value $V_1$ (400 volts), and performs subsequent steps when the control circuit 13 determines that the voltage of the output capacitor 12 is at the predetermined high voltage value $V_1$.

Steps S14, S15 and S16: When the control circuit 13 determines that the voltage of the output capacitor 12 is at the predetermined high voltage value $V_1$ (400 volts), the control circuit 13 controls the converter circuit 11 to stop supplying electricity to the output capacitor such that the output capacitor 12 discharges electricity to the load 3. When the output capacitor 12 starts discharging electricity to the load 3, the control circuit 13 records an initial time $T_1$ related to start of discharging by the output capacitor 12. During the discharging by the output capacitor 12, the control circuit 13 further determines an average power value $W_1$ related to the electricity discharged by the output capacitor 12 within the time interval $\Delta T_1$.

While the output capacitor 12 is discharging, the control circuit 13 monitors and determines if the voltage of the output capacitor 12 has decreased to the predetermined low voltage value $V_2$ (380 volts), and performs the following steps when the control circuit 13 determines that the voltage of the output capacitor 12 is at the predetermined low voltage value $V_2$.

Step S17: When the control circuit 13 determines that the voltage of the output capacitor 12 is at the predetermined low voltage value $V_2$ in step S16, the control circuit 13 has finished monitoring of the output capacitor 12 discharging electricity to the load 3, and the control circuit 13 records the final time $T_2$ related to end of discharging by the output capacitor 12. Subsequently, the control circuit 13 controls the converter circuit 11 to start providing output power to the capacitor 12 and the load 3.

Step S18: After the completion of steps S11-S17, the control circuit 13 determines the estimated capacitance value $C_{bulk}$ by calculating based on the predetermined high voltage value $V_1$, the predetermined low voltage value $V_2$, the average power value $W_1$, the initial time $T_1$ and the final time $T_2$.

In steps S11-S18, the control circuit 13 is preset with a predetermined low voltage value $V_2$ and monitors the output capacitor 12 while the output capacitor 12 is discharging electricity to the load 3. Hence, the voltage of the output capacitor 12 can be maintained to be above the predetermined low voltage value $V_2$ while steps S11-S18 are being performed, such that the load 3 is able to operate normally throughout the steps S11-S18.

Method 2. Electricity Charging Method

Figure 4:
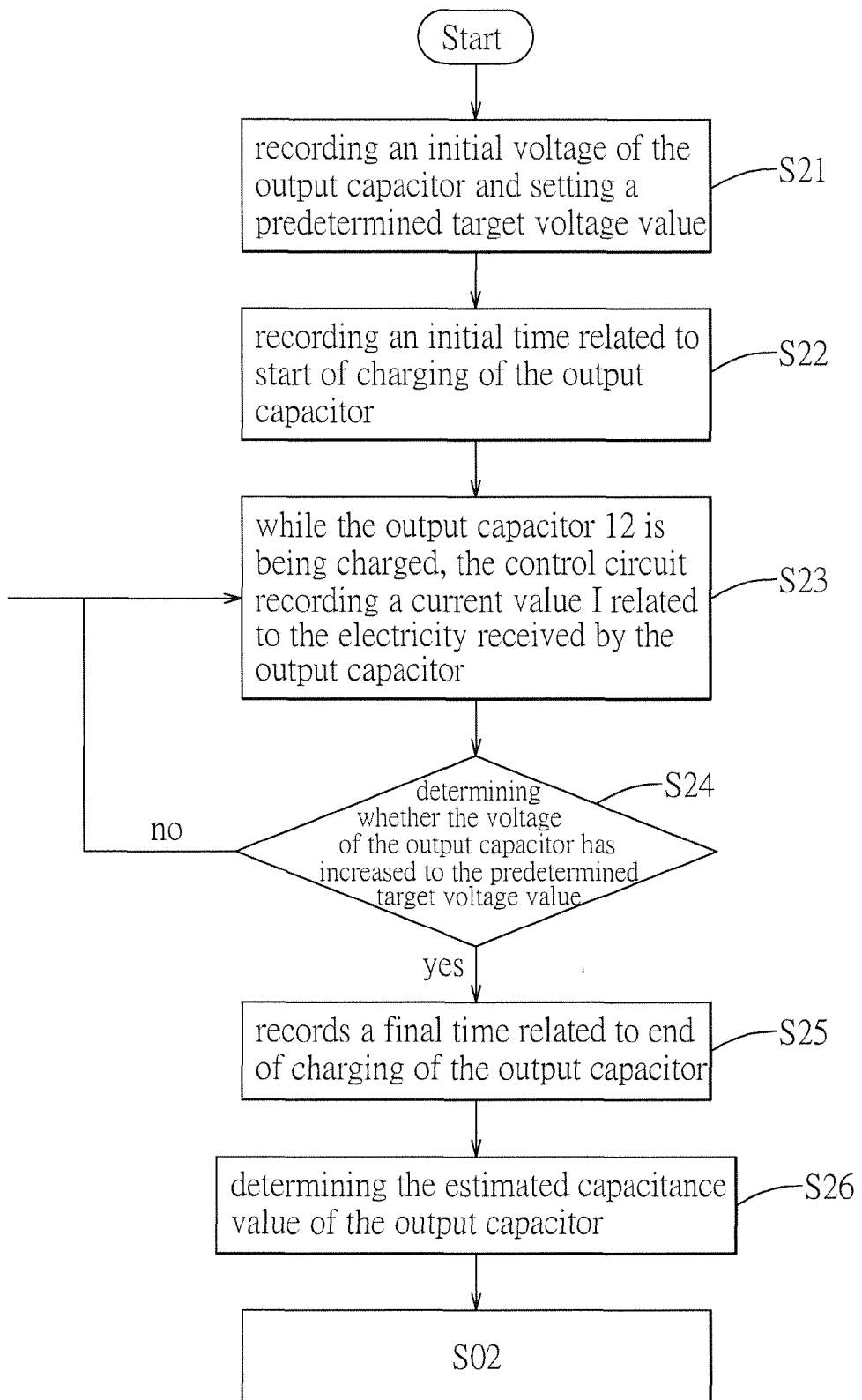

Referring to FIG. 4, the estimated capacitance value $C_{bulk}$ of the output capacitor 12 is determined by charging the output capacitor 12, and by calculating according to the formula:

$$C_{bulk} = \frac{I \cdot \Delta T_2}{V_4 - V_2}$$

where $C_{bulk}$ represents the estimated capacitance value of the output capacitor 12; $V_3$ represents an initial voltage before charging of the output capacitor 12; $V_4$ represents a predetermined target voltage value (final voltage of the output capacitor 12) of the output capacitor 12 after charging; and $\Delta T_2$ represents a time interval during which the output capacitor 12 is charged from the initial voltage $V_3$ to the predetermined target voltage value $V_4$ (the initial voltage of the output capacitor 12 is less than the final voltage of the output capacitor 12). The time interval $\Delta T_2$ may be calculated according to the formula:

$$\Delta T_2 = T_4 - T_2$$

where $T_3$ represents an initial time related to start of charging of the output capacitor 12 by the converter circuit 11, and $T_4$ represents a final time related to end of charging of the output capacitor 12 by the converter circuit 11. Moreover, I represents an average current value related to the electricity received by the output capacitor 12 within the time interval $\Delta T_2$ during which the output capacitor 12 is charged.

In steps S21, S22, S23 and S24: The control circuit 13 records a present voltage of the output capacitor 12 as the initial voltage $V_3$ (for example 385 volts), controls the converter circuit 11 to provide electricity to charge the output capacitor 12 to a predetermined target voltage value $V_4$ (for example 400 volts), and records an initial time $T_3$ related to start of charging of the output capacitor 12 by the converter circuit 11.

While the output capacitor 12 is being charged, the control circuit 13 records a current value I related to the electricity received by the output capacitor 12 within the time interval $\Delta T_2$, and monitors to determine whether the voltage of the output capacitor 12 has increased to the predetermined target voltage value $V_4$.

Step S25: When the control circuit 13 determines that the voltage of the output capacitor 12 is at the predetermined target voltage value $V_4$, the charging of the output capacitor 12 control led by the control circuit 13 is completed. At this moment, the control circuit 13 records a final time $T_4$ related to end of charging of the output capacitor 12 by the converter circuit 11.

Step S26: After the completion of steps S21-S25, the control circuit 13 determines the estimated capacitance value $C_{bulk}$ based on the predetermined target voltage value $V_1$, the initial voltage $V_3$, the current value I, the initial time $T_3$ and the final time $T_4$.

During steps S21-S25, the power supply system 1 constantly provides electricity required by the load 3, while the charging of the output capacitor 12 is constantly monitored by the control circuit 13. The control circuit 13 also stores the necessary information for calculation of the estimated capacitance value $C_{bulk}$.

The above-mentioned methods of discharging electricity by the output capacitor 12 and charging electricity to the output capacitor 12 are performed while the power supply system 1 continuously provides electricity to the load 3. During the time interval (discharging or charging of the output capacitor 12), the control circuit 13 detects an initial voltage (the predetermined high voltage value $V_1$ or the initial voltage $V_3$) of the output capacitor 12 at the beginning of the time interval and a final voltage (the predetermined low voltage value $V_2$ or the predetermined target voltage value $V_4$) of the output capacitor 12 at the end of the time interval, and detects the electricity outputted or received by the output capacitor 12. The control circuit 13 then determines the estimated capacitance value $C_{bulk}$ related to the output capacitor 12 by calculating based on these detected values. A third method for determining the estimated capacitance value $C_{bulk}$ related to the output capacitor 12 utilizes a mechanism that is different from the first and second methods.

Method 3. Ripple Voltage Method

The estimated capacitance value $C_{bulk}$ of the output capacitor 12 is determined by detecting a ripple voltage of the output capacitor 12, and by calculating according to the formula:

$$C_{bulk} = \frac{V_{in} \cdot I_{in}}{4\pi \cdot V_{ripple} \cdot V_{out} \cdot f}$$

where $C_{bulk}$ represents the estimated capacitance value of the output capacitor 12, $V_{in}$, $I_{in}$ and f represent an input voltage value, an input current value, and an input frequency value related to voltage, current and frequency of the electricity received by the converter circuit 11 from the external power source 2, $V_{ripple}$ represents a maximum ripple voltage value related to a ripple voltage of the output capacitor 12, and $V_{out}$ represents an output voltage value related to voltage outputted by the converter circuit 11 to the output capacitor 12 and the load 3.

The control circuit 13 detects and receives the input voltage value $V_{in}$, the input current value $I_{in}$, and the input frequency value f related to the electricity from the external power source 2, receives the output voltage value $V_{out}$ related to voltage outputted by the converter circuit 11 to the output capacitor 12 and the load 3, and receives the maximum ripple voltage value $V_{ripple}$ related to the ripple voltage of the output capacitor 12.

Subsequently, the control circuit 13 is able to determine the estimated capacitance value $C_{bulk}$ by calculating based on the input voltage value $V_{in}$, the input current value $I_{in}$, the input frequency value f, the output voltage value $V_{out}$, and the maximum ripple voltage value $V_{ripple}$.

In the ripple voltage method, an estimated capacitance value $C_{bulk}$ related to the output capacitor 12 is determined while the power supply system 1 is continuously providing electricity to the load 3, and thus the estimated capacitance value $C_{bulk}$ can be detected instantly on-line.

Referring again to FIG. 2, the estimated capacitance value $C_{bulk}$ related to the output capacitor 12 can be determined by calculating according to the three methods as described in the above. After completing step S01, subsequent steps can be performed.

Step S02: After the estimated capacitance value $C_{bulk}$ related to the output capacitor 12 is determined, an estimated hold-up time value related to the power supply system 1 can be determined. The estimated hold-up time value can be determined according to the formula:

$$T_{hold-up} = \frac{C_{bulk} \cdot (V_{target}^2 - V_{break}^2)}{2 \cdot W_2}$$

where $T_{hold-up}$ represents an estimated hold-up time related to the power supply system 1; $C_{bulk}$ represents the estimated capacitance value of the output capacitor 12; $V_{target}$ represents a predetermined target voltage value associated with an amount of electricity required by the output capacitor for hold-up operation of the power supply system 1 and provided by the converter circuit 11 to the output capacitor 12; $V_{break}$ represents a predetermined minimum voltage value associated with a minimum voltage of the output capacitor 12; and $W_2$ represents an average power value related to the electricity provided by the output capacitor 12 to the load 3.

According to the above formula, the control circuit 13 determines the estimated hold-up time value related to the power supply system by calculating based on the predetermined target voltage value $V_{target}$, the predetermined minimum voltage value $V_{break}$, the average power value $W_2$ and the estimated capacitance value $C_{bulk}$ determined in step S01. Step S02 is also performed while the power supply system 1 is continuously providing electricity to the load 3. The predetermined target voltage value $V_{target}$ and the predetermined minimum voltage value $V_{break}$ can be pre-stored in the control circuit 13, or can be set by a user according to the user's needs, or by other methods.

Steps S03, S04, S05 and S06: After determining the estimated hold-up time $T_{hold-up}$, further steps related to power management may be performed. For example, a user can input a predetermined target hold-up time value $T_{target}$, and the control circuit 13 determines whether the estimated hold-up time value $T_{hold-up}$ is less than the predetermined target hold-up time value $T_{target}$. When the control circuit 13 determines that the estimated hold-up time value $T_{hold-up}$ is less than the predetermined target hold-up time value $T_{target}$, the estimated hold-up time value $T_{hold-up}$ is too short, and the control circuit 13 outputs an alarm signal for the power supply system 1 to transmit to other peripheral devices (not shown in the Figures) using communication protocols such as inter-integrated circuit (I²C), universal asynchronous receiver/transmitter (UART), controller area network (CAN), serial peripheral interface bus (SPI), etc, or using a specific input-output port. The power supply system 1 or other peripheral devices can further be controlled to output signals (such as a flashing light, alarm, or notification information displayed on a display screen) for reminding a user that the estimated hold-up time value $T_{hold-up}$ is too short. Furthermore, when the estimated hold-up time value $T_{hold-up}$ is too short, the control circuit 13 can control the converter circuit 11 to provide electricity to the output capacitor 12 to increase the voltage of the output capacitor 12, thereby increasing the estimated hold-up time value $T_{hold-up}$ of the power supply system 1.

On the other hand, when the control circuit 13 determines that the estimated hold-up time value $T_{hold-up}$ is greater than the predetermined target hold-up time value $T_{target}$ (the estimated hold-up time value $T_{hold-up}$ is sufficient), the user may set the control circuit 13 to automatically control the converter circuit 11 to adjust the electricity provided to the output capacitor 12 to reduce the voltage of the output capacitor 12 (thus prolonging the lifespan of the output capacitor 12), while ensuring that the estimated hold-up time value $T_{hold-up}$ is sufficiently long.

By the virtue of control method for implementation in the power supply system 1, and is the power supply system 1 is capable of adjusting the estimated hold-up time value $T_{hold-up}$ of the power supply system 1, capable of outputting an alarm signal for reminding a user. The power supply system 1 is also capable of informing the user of the current status of the power supply system 1 by notifying the user of the estimated hold-up time value $T_{hold-up}$ and the estimated capacitance value $C_{bulk}$, such that the user can manage the power supply system 1 by modifying the predetermined target hold-up time value $T_{target}$.

In summary, the control method for implementation in the power supply system 1 of the present invention, while electricity is being provided to the load 3 by the power supply system, enables determining the estimated capacitance value $C_{bulk}$ related to the output capacitor 12 and the estimated hold-up time value $T_{hold-up}$ related to the power supply system 1, and providing such information to the user.

Furthermore, the control method in the present invention enables outputting an alarm signal for reminding a user, and notifying the user of the estimated hold-up time value $T_{hold-up}$ and the estimated capacitance value $C_{bulk}$, such that voltage of the output capacitor 12 can be regulated according to the length of the estimated hold-up time value $T_{hold-up}$ with respect to the predetermined target hold-up time value $T_{target}$ and that the user can be assisted in power management of the power supply system 1.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A control method for implementation in a power supply system, the power supply system including a converter circuit, an output capacitor electrically coupled with the converter circuit, and a control circuit electrically coupled with the converter circuit and the output capacitor, the power supply system being configured to provide electricity to a load, the control method comprising:
   (A) while the power supply system is providing electricity to the load, determining, using the control circuit, an estimated capacitance value related to the output capacitor;
   (B) while the output capacitor is providing electricity to the load, determining, using the control circuit, an average power value related to the electricity provided by the output capacitor to the load; and
   (C) determining, using the control circuit, an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;
   wherein, in (A), the control circuit determines the estimated capacitance value based on an initial voltage of the output capacitor at the beginning of a time interval, and a final voltage of the output capacitor at the end of the time interval;
   wherein, in (A), the time interval is related to the output capacitor discharging electricity to the load, and the initial voltage of the output capacitor is greater than the final voltage of the output capacitor;
   wherein determining the estimated capacitance value in (A) includes:
   (A1) the control circuit determining whether the voltage of the output capacitor is at a predetermined high voltage value corresponding to the initial voltage of the output capacitor;
   (A2) when the control circuit determines that the voltage of the output capacitor is at the predetermined high voltage value in (A1), the control circuit controlling the converter circuit to stop supplying electricity to the output capacitor such that the output capacitor discharges electricity to the load, and the control circuit recording an initial time related to start of discharging by the output capacitor;
   (A3) the control circuit determining whether the voltage of the output capacitor is at a predetermined low voltage value corresponding to the final voltage of the output capacitor;
   (A4) when the control circuit determines that the voltage of the output capacitor is at the predetermined low voltage value in (A3), the control circuit recording a final time related to end of discharging by the output capacitor;
   (A5) the control circuit determining an average power value related to the electricity discharged by the output capacitor within the time interval; and
   (A6) the control circuit determining the estimated capacitance value based on the predetermined high voltage value, the predetermined low voltage value, the average power value, the initial time and the final time.

2. A control method for implementation in a power supply system, the power supply system including a converter circuit, an output capacitor electrically coupled with the converter circuit, and a control circuit electrically coupled with the converter circuit and the output capacitor, the power supply system being configured to provide electricity to a load, the control method comprising:
   (A) while the power supply system is providing electricity to the load, determining, using the control circuit, an estimated capacitance value related to the output capacitor;
   (B) while the output capacitor is providing electricity to the load, determining, using the control circuit, an average power value related to the electricity provided by the output capacitor to the load; and
   (C) determining, using the control circuit, an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;
   wherein, in (A), the control circuit determines the estimated capacitance value based on an initial voltage of the output capacitor at the beginning of a time interval, and a final voltage of the output capacitor at the end of the time interval;
   wherein, in (A), the time interval is related to the converter circuit charging electricity to the output capacitor, and the initial voltage of the output capacitor is less than the final voltage of the output capacitor;
   wherein determining the estimated capacitance value in (A) includes:
   (A1) the control circuit recording a present voltage of the output capacitor as the initial voltage, controlling the converter circuit to provide electricity to charge the output capacitor to a predetermined target voltage value corresponding to the final voltage of the output capacitor, and recording an initial time related to start of charging of the output capacitor by the converter circuit;
   (A2) when the control circuit determines that the voltage of the output capacitor is at the predetermined target voltage value, the control circuit recording a final time related to end of charging of the output capacitor by the converter circuit;

(A3) the control circuit recording a current value related to the electricity received by the output capacitor within the time interval; and (A4) the control circuit determining the estimated capacitance value based on the predetermined target voltage value, the initial voltage, the current value, the initial time and the final time.

3. A control method for implementation in a power supply system, the power supply system including a converter circuit, an output capacitor electrically coupled with the converter circuit, and a control circuit electrically coupled with the converter circuit and the output capacitor, the power supply system being configured to provide electricity to a load, the control method comprising:

(A) while the power supply system is providing electricity to the load, determining, using the control circuit, an estimated capacitance value related to the output capacitor;

(B) while the output capacitor is providing electricity to the load, determining, using the control circuit, an average power value related to the electricity provided by the output capacitor to the load; and (C) determining, using the control circuit, an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;

wherein determining the estimated capacitance value in (A) includes:

(A1) while the power supply system is providing electricity to the load, the control circuit recording an input voltage value, an input current value, and an input frequency value related to voltage, current and frequency of the electricity received by the converter circuit from the external power source, recording an output voltage value related to voltage outputted by the converter circuit to the output capacitor, and recording a maximum ripple voltage value related to a ripple voltage of the output capacitor; and (A2) the control circuit determining the estimated capacitance value based on the input voltage value, the input current value, the input frequency value, the output voltage value, and the maximum ripple voltage value.

4. A control method for implementation in a power supply system, the power supply system including a converter circuit, an output capacitor electrically coupled with the converter circuit, and a control circuit electrically coupled with the converter circuit and the output capacitor, the power supply system being configured to provide electricity to a load, the control method comprising:

(A) while the power supply system is providing electricity to the load, determining, using the control circuit, an estimated capacitance value related to the output capacitor;

(B) while the output capacitor is providing electricity to the load, determining, using the control circuit, an average power value related to the electricity provided by the output capacitor to the load; and (C) determining, using the control circuit, an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;

said control method further comprising, after (C):

(D) determining, using the control circuit, whether the estimated hold-up time value is less than a predetermined target hold-up time value; and (E) when the control circuit determines that the estimated hold-up time value is less than the predetermined target hold-up time value, performing, using the control circuit, at least one of: outputting an alarm signal; and controlling the converter circuit to provide electricity to the output capacitor to increase the voltage of the output capacitor.

5. The control method as claimed in claim 4, wherein, in (A), the control circuit determines the estimated capacitance value based on an initial voltage of the output capacitor at the beginning of a time interval, and a final voltage of the output capacitor at the end of the time interval.

6. The control method as claimed in claim 5, wherein, in (A), the time interval is related to the output capacitor discharging electricity to the load, and the initial voltage of the output capacitor is greater than the final voltage of the output capacitor.

7. The control method as claimed in claim 6, wherein determining the estimated capacitance value in (A) includes:

(A1) the control circuit determining whether the voltage of the output capacitor is at a predetermined high voltage value corresponding to the initial voltage of the output capacitor;

(A2) when the control circuit determines that the voltage of the output capacitor is at the predetermined high voltage value in (A1), the control circuit controlling the converter circuit to stop supplying electricity to the output capacitor such that the output capacitor discharges electricity to the load, and the control circuit recording an initial time related to start of discharging by the output capacitor;

(A3) the control circuit determining whether the voltage of the output capacitor is at a predetermined low voltage value corresponding to the final voltage of the output capacitor;

(A4) when the control circuit determines that the voltage of the output capacitor is at the predetermined low voltage value in (A3), the control circuit recording a final time related to end of discharging by the output capacitor;

(A5) the control circuit determining an average power value related to the electricity discharged by the output capacitor within the time interval; and (A6) the control circuit determining the estimated capacitance value based on the predetermined high voltage value, the predetermined low voltage value, the average power value, the initial time and the final time.

8. The control method as claimed in claim 5, wherein, in (A), the time interval is related to the converter circuit charging electricity to the output capacitor, and the initial voltage of the output capacitor is less than the final voltage of the output capacitor.

9. The control method as claimed in claim 4, the power supply system being configured to receive electricity from an external power source, wherein determining the estimated capacitance value in (A) includes:
- (A1) while the power supply system is providing electricity to the load, the control circuit recording an input voltage value, an input current value, and an input frequency value related to voltage, current and frequency of the electricity received by the converter circuit from the external power source, recording an output voltage value related to voltage outputted by the converter circuit to the output capacitor, and recording a maximum ripple voltage value related to a ripple voltage of the output capacitor; and
- (A2) the control circuit determining the estimated capacitance value based on the input voltage value, the input current value, the input frequency value, the output voltage value, and the maximum ripple voltage value.

10. The control method as claimed in claim 4, further comprising:
- (F) when the control circuit determines that the estimated hold-up time value is greater than the predetermined target hold-up time value, controlling, using the control circuit, the converter circuit to adjust the electricity provided to the output capacitor to reduce the voltage of the output capacitor.

11. A power supply system configured to receive electricity from an external power source and to convert the electricity from the external power source into output power to be provided to a load, the power supply system comprising:
- a converter circuit to be electrically coupled with the external power source to receive the electricity therefrom, and operable to output the electricity from the external power source after conversion;
- an output capacitor electrically coupled with the converter circuit and to be coupled with the load, the output capacitor receiving electricity from the converter circuit and being charged and discharged under control of the converter circuit; and
- a control circuit electrically coupled with the converter circuit and the output capacitor, and operable to control operation of the converter circuit; wherein:
- while the power supply system is providing electricity to the load, the control circuit is configured to determine an estimated capacitance value related to the output capacitor;
- while the output capacitor is providing electricity to the load, the control circuit is further configured to determine an average power value related to the electricity provided by the output capacitor to the load; and
- the converter circuit is further configured to determine an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;
- wherein the control circuit is configured to determine the estimated capacitance value based on an initial voltage of the output capacitor at the beginning of a time interval, and on a final voltage of the output capacitor at the end of the time interval;
- wherein the time interval is related to the output capacitor discharging electricity to the load, and the initial voltage of the output capacitor is greater than the final voltage of the output capacitor;
- wherein the control circuit determines the estimated capacitance value by:
- controlling the converter circuit to control supply of electricity to the output capacitor in a manner that the output capacitor discharges electricity to the load from a predetermined high voltage value corresponding to the initial voltage of the output capacitor to a predetermined low voltage value corresponding to the final voltage of the output capacitor;
- recording an initial time related to start of discharging by the output capacitor and a final time related to end of discharging by the output capacitor;
- determining an average power value related to the electricity discharged by the output capacitor within the time interval; and
- determining the estimated capacitance value based on the predetermined high voltage value, the predetermined low voltage value, the average power value, the initial time and the final time.

12. A power supply system configured to receive electricity from an external power source and to convert the electricity from the external power source into output power to be provided to a load, the power supply system comprising:
- a converter circuit to be electrically coupled with the external power source to receive the electricity therefrom, and operable to output the electricity from the external power source after conversion;
- an output capacitor electrically coupled with the converter circuit and to be coupled with the load, the output capacitor receiving electricity from the converter circuit and being charged and discharged under control of the converter circuit; and
- a control circuit electrically coupled with the converter circuit and the output capacitor, and operable to control operation of the converter circuit; wherein:
- while the power supply system is providing electricity to the load, the control circuit is configured to determine an estimated capacitance value related to the output capacitor;
- while the output capacitor is providing electricity to the load, the control circuit is further configured to determine an average power value related to the electricity provided by the output capacitor to the load; and
- the converter circuit is further configured to determine an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;
- wherein the control circuit is configured to determine the estimated capacitance value based on an initial voltage of the output capacitor at the beginning of a time interval, and on a final voltage of the output capacitor at the end of the time interval;

wherein the time interval is related to the converter circuit charging electricity to the output capacitor, and the initial voltage of the output capacitor is less than the final voltage of the output capacitor;

wherein the control circuit determines the estimated capacitance value by:

recording a present voltage of the output capacitor as the initial voltage;

controlling the converter circuit to provide electricity to charge the output capacitor to a predetermined target voltage value corresponding to the final voltage of the output capacitor;

recording an initial time related to start of charging of the output capacitor by the converter circuit, a final time related to end of charging of the output capacitor by the converter circuit, and a current value related to the electricity received by the output capacitor within the time interval; and determining the estimated capacitance value based on the predetermined target voltage value, the initial voltage, the current value, the initial time and the final time.

13. A power supply system configured to receive electricity from an external power source and to convert the electricity from the external power source into output power to be provided to a load, the power supply system comprising:

a converter circuit to be electrically coupled with the external power source to receive the electricity therefrom, and operable to output the electricity from the external power source after conversion;

an output capacitor electrically coupled with the converter circuit and to be coupled with the load, the output capacitor receiving electricity from the converter circuit and being charged and discharged under control of the converter circuit; and a control circuit electrically coupled with the converter circuit and the output capacitor, and operable to control operation of the converter circuit; wherein:

while the power supply system is providing electricity to the load, the control circuit is configured to determine an estimated capacitance value related to the output capacitor;

while the output capacitor is providing electricity to the load, the control circuit is further configured to determine an average power value related to the electricity provided by the output capacitor to the load; and the converter circuit is further configured to determine an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;

wherein the control circuit determines the estimated capacitance value by:

while the power supply system is providing electricity to the load, recording an input voltage value, an input current value, and an input frequency value related to voltage, current and frequency of the electricity received by the converter circuit from the external power source, recording an output voltage value related to voltage outputted by the converter circuit to the output capacitor, and recording a maximum ripple voltage value related to a ripple voltage of the output capacitor; and determining the estimated capacitance value based on the input voltage value, the input current value, the input frequency value, the output voltage value, and the maximum ripple voltage value.

14. A power supply system configured to receive electricity from an external power source and to convert the electricity from the external power source into output power to be provided to a load, the power supply system comprising:

a converter circuit to be electrically coupled with the external power source to receive the electricity therefrom, and operable to output the electricity from the external power source after conversion;

an output capacitor electrically coupled with the converter circuit and to be coupled with the load, the output capacitor receiving electricity from the converter circuit and being charged and discharged under control of the converter circuit; and a control circuit electrically coupled with the converter circuit and the output capacitor, and operable to control operation of the converter circuit; wherein:

while the power supply system is providing electricity to the load, the control circuit is configured to determine an estimated capacitance value related to the output capacitor;

while the output capacitor is providing electricity to the load, the control circuit is further configured to determine an average power value related to the electricity provided by the output capacitor to the load; and the converter circuit is further configured to determine an estimated hold-up time value related to the power supply system based on a predetermined target voltage value, a predetermined minimum voltage value, the average power value and the estimated capacitance value, wherein the predetermined target voltage value is associated with an amount of electricity required by the output capacitor for hold-up operation of the power supply system and provided by the converter circuit to the output capacitor, and wherein the predetermined minimum voltage value is associated with a minimum voltage of the output capacitor;

wherein, when the control circuit determines that the estimated hold-up time value is less than a predetermined target hold-up time value, the control circuit is configured to perform at least one of:

outputting an alarm signal; and controlling the converter circuit to provide electricity to the output capacitor to increase the voltage of the output capacitor.

15. The power supply system as claimed in claim 14, wherein, when the control circuit determines that the estimated hold-up time value is greater than the predetermined target hold-up time value, the control circuit is configured to control the converter circuit to adjust the electricity provided to the output capacitor to reduce the voltage of the output capacitor.

16. The power supply system as claimed in claim 14, wherein the control circuit is configured to determine the estimated capacitance value based on an initial voltage of the output capacitor at the beginning of a time interval, and on a final voltage of the output capacitor at the end of the time interval.

17. The power supply system as claimed in claim 16, wherein the time interval is related to the output capacitor discharging electricity to the load, and the initial voltage of the output capacitor is greater than the final voltage of the output capacitor.

18. The power supply system as claimed in claim 17, wherein the control circuit determines the estimated capacitance value by:
  controlling the converter circuit to control supply of electricity to the output capacitor in a manner that the output capacitor discharges electricity to the load from a predetermined high voltage value corresponding to the initial voltage of the output capacitor to a predetermined low voltage value corresponding to the final voltage of the output capacitor;
  recording an initial time related to start of discharging by the output capacitor and a final time related to end of discharging by the output capacitor;
  determining an average power value related to the electricity discharged by the output capacitor within the time interval; and
  determining the estimated capacitance value based on the predetermined high voltage value, the predetermined low voltage value, the average power value, the initial time and the final time.

19. The power supply system as claimed in claim 16, wherein the time interval is related to the converter circuit charging electricity to the output capacitor, and the initial voltage of the output capacitor is less than the final voltage of the output capacitor.

20. The power supply system as claimed in claim 14, wherein the control circuit determines the estimated capacitance value by:
  while the power supply system is providing electricity to the load, recording an input voltage value, an input current value, and an input frequency value related to voltage, current and frequency of the electricity received by the converter circuit from the external power source, recording an output voltage value related to voltage outputted by the converter circuit to the output capacitor, and recording a maximum ripple voltage value related to a ripple voltage of the output capacitor; and
  determining the estimated capacitance value based on the input voltage value, the input current value, the input frequency value, the output voltage value, and the maximum ripple voltage value.

* * * * *